United States Patent [19]

Berger

[11] 4,158,803
[45] Jun. 19, 1979

[54] SWITCHING HIGH VOLTAGE POWER SUPPLY

[75] Inventor: John G. Berger, Elizabethtown, Pa.

[73] Assignee: AMP Incorporated, Harrisburg, Pa.

[21] Appl. No.: 838,036

[22] Filed: Sep. 29, 1977

[51] Int. Cl.² ............................................. G05F 1/52
[52] U.S. Cl. ..................................... 323/21; 307/85; 315/153; 323/41
[58] Field of Search ............... 315/153, 367, 395, 404, 315/410, 411; 323/21, 22 V, 23, 25, 41; 358/190, 243; 307/77, 85

[56] References Cited

U.S. PATENT DOCUMENTS

| | | | |
|---|---|---|---|
| 2,415,177 | 2/1947 | Hurley | 315/153 X |
| 2,495,919 | 1/1950 | Brunn | 323/41 X |
| 3,044,007 | 7/1962 | Akers | 323/22 V |
| 3,226,560 | 12/1965 | Staschover | 323/22 V |
| 3,483,425 | 12/1969 | Yanishevsky | 323/25 X |
| 3,524,986 | 8/1970 | Harnden | 323/21 UX |
| 3,772,606 | 11/1973 | Waehner | 323/23 UX |
| 3,859,557 | 1/1975 | Grant et al. | 315/395 X |
| 4,027,228 | 5/1977 | Collins | 323/21 |
| 4,124,886 | 11/1978 | Black et al. | 323/21 X |

OTHER PUBLICATIONS

Mitchell et al, "Simulating an NPN/PNP pair for High-Voltage Switching", Electronics, Aug. 22, 1974, p. 112.

Primary Examiner—A. D. Pellinen
Attorney, Agent, or Firm—Russell J. Egan; Richard B. O'Planick

[57] ABSTRACT

A circuit to provide a fast convenient means of amplifying a low level analog/digital signal to very high voltage to drive a large capacitance of a multi-colored cathode ray tube. The circuit employs two high voltage/frequency planar triodes to source and sink, respectively, current to the highly capacitive load. The "source" tube receives its control from a low level source through a high voltage/optical isolator and the "sink" tube receives its control signal in much the same manner, but without an isolator.

3 Claims, 2 Drawing Figures

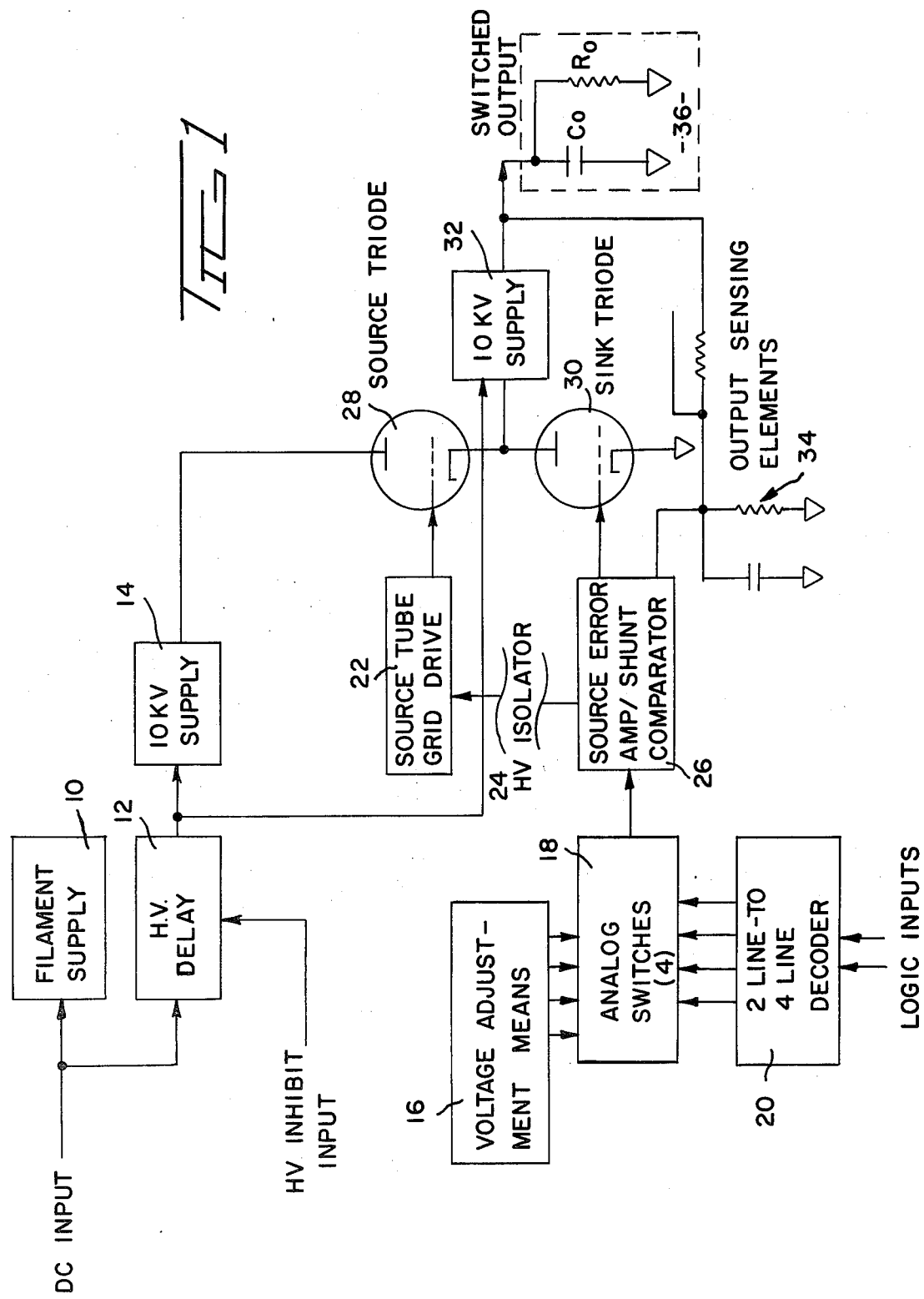

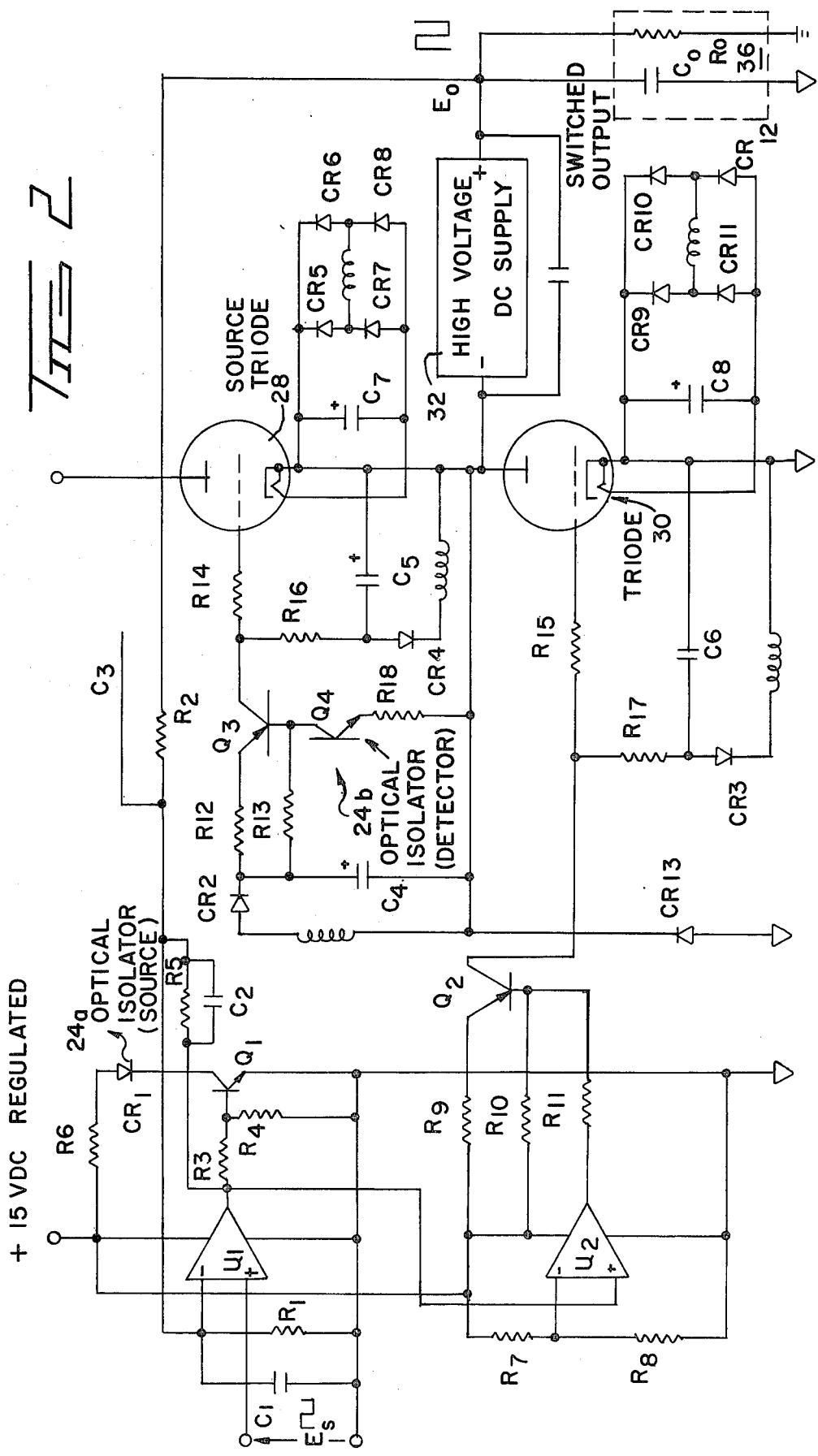

SWITCHING HIGH VOLTAGE POWER SUPPLY

BACKGROUND OF THE INVENTION

1. The Field Of The Invention

The present invention relates to a switching high voltage power supply and in particular to a fast acting amplifier for use in driving a capacitance of a multi-colored cathode ray tube.

2. The Prior Art

Switchable high voltage power supplies are well known in and of themselves. For example, U.S. Pat. No. 3,659,190 shows a switchable high voltage power supply which uses two series connected transistor chains. However, this device has a disadvantage in that it is relatively expensive due to the large number of transistors involved and the numerous connections that are required.

A further example of a switchable high voltage power supply may be found in U.S. Pat. No. 3,892,977 which has a basic voltage source and a plurality of switching voltage sources in series therewith. The sources are switchable into and out of the circuit by logic circuitry which is not electrically referenced to the sources. However, this device is still relatively expensive due to the large number of components involved therein.

SUMMARY OF THE INVENTION

The present invention relates to a high voltage power supply having the capability of rapidly switching between voltage states thus making the circuit suitable for use in driving a large capacitance of a multi-colored cathode ray tube or the like. The subject circuit includes a pair of high voltage/frequency planar triodes as a source and sink, respectively, for the current to a highly capacitive load. The source tube receives a control input from a low level source through a high voltage optical isolator while the sink tube receives its control signal much in the same manner, but without the use of an isolator.

It is therefore an object of the present invention to produce an improved high speed, high voltage switching power supply which can amplify a low level analog/digital signal to a very high voltage to drive a large capacitance and remain relatively immune to high voltage arcing to ground plane structures.

It is also an object of the present invention to produce an improved switching power supply having rise and fall times which are much faster than previously attained by known power supplies.

It is a further object of the present invention to produce an improved switching high voltage amplifier which can be readily and economically produced.

The means for accomplishing the foregoing objects and other advantages will become apparent to those skilled in the art from the following detailed description taken with reference to the accompanying drawings.

BRIEF DESCRIPTION OF THE DRAWINGS

FIG. 1 is a block level schematic of the subject switching high voltage power supply; and FIG. 2 is an electrical schematic detailing the novel portion of the subject switching high voltage power supply.

DETAILED DESCRIPTION OF THE PREFERRED EMBODIMENT

The circuit involved with the subject power supply is shown in FIG. 1 and includes a filament supply 10, a high voltage delay 12, a high voltage supply 14, high voltage adjustment means 16, a plurality of analog switches 18, a decoder 20, a source tube grid driver 22, a high voltage isolator 24, a source error amplifier and shunt comparator 26, a source triode 28, a sink triode 30, and an output voltage supply 32, sensing elements 34, and a switched output to the load 36.

The above circuit functions as follows. The filament supply 10 provides the necessary DC voltages and DC isolation to heat the cathodes of both triodes 28, 30 to their operating temperatures. The voltage delay 12 retards application of high voltage to the triodes for from 60 seconds to 90 seconds to prevent stripping of the cathode before the cathode material has been sufficiently warmed to allow emission. The ten kilovolt power supply 14 provides an operating plate voltage for the planar triodes 28, 30. The voltage adjustment means 16 consists of four potentiometers which each give an adjustable DC voltage to a respective analog switch 18. The individual reference voltages are those voltages after which the output potential levels are patterned. According to the digital control input to the analog switches 18, selection is made for which of the reference voltages will be applied to the source error amplifier 26. Thus, as the digital control signal changes, the reference voltage also changes as well as the output. The two line to four line decoder 20 changes the two-bit input to a four-bit output to drive the four channel analog switches 18. The source tube grid driver 22 converts the linear control inputs from the source error amplifier 26, via the optical isolator 24, to a potential level compatible to the triode grid voltage requirement. The high voltage isolator 24 transfers the control signals to the source tube grid driver 22 while maintaining a large DC voltage isolation required by the source triode 28. The source error amplifier and shunt comparator 26 is a dual function block which distributes information to control both the source and sink triodes 28, 30. The source error amplifier 26 compares the input signal $E_s$ with an analogous divided down output voltage $E_o$. The amplifier (a differential configuration) forces the high voltage to a level that causes the differential between $E_s$ and the analog to be close to zero. This assures that $E_o$, the output voltage, will always follow the input $E_s$.

The function of the comparator 26 can be understood by application of some basic facts. The sink tube 30 only conducts during downward input transitions, when the falling slope of the input $E_s$ is greater than the slope represented by the $R_o C_o$ discharge mechanism. The sink tube 30 may also conduct momentarily should the output voltage overshoot the intended potential during an upward transition. The source tube 28 conducts only when the sink tube 30 is in a non-conducting state. The sink tube 30 receives information from the shunt comparator 26. When $E_s$ undergoes a downward (negative going) transition, the source error amplifier output is of a pulse nature. The amplitude of this pulse is compared with a non-varying DC reference in the comparator 26. When the pulse input exceeds the DC reference, the comparator 26 instructs the sink tube 30 to conduct. When the output voltage slews to the new intended level, the comparator 26 receives instructions to turn the sink tube 30 off. Thus the comparator 26 is a device that insures that the source tube 28 and the sink tube 30 never conduct coincidentally. The source tube 28 is responsible for rapidly charging the output capacitance to some desired level while the sink tube 30 is responsible for rapidly discharging the output capacitance to the new lower programmed voltage. The 10 KV supply 14 is a scaling voltage factor which raises the average DC output by a factor of the difference between the voltage supplies. This allows a higher circuit output level with a relatively lower plate voltage rating on the planar triode since only the first power supply 14 is the maximum plate voltage seen by either tube at any time. The output sensing elements form a frequency compensated high voltage divider to provide a scaled down analog of the output of the inverting terminal of the source error amplifier and shunt comparator. The switched output load is represented simply by the output capacitance and resistance.

With specific reference to the electrical schematic of the subject invention as shown in FIG. 2, two conventional filament supply circuits are shown to comprise the elements $C_7$, $CR_5$, $CR_6$, $CR_7$, $CR_8$, and $C_8$, $CR_9$, $CR_{10}$, $CR_{11}$, $CR_{12}$, respectively. One of the filament supply circuits is electrically connected to the cathode of each of the triodes 28, 30 to heat the cathodes to operating temperature.

The source tube grid driver comprises circuits elements $Q_3$, $Q_4$, $C_4$, $C_5$, $CR_2$, $CR_4$, $R_{12}$, $R_{13}$, $R_{14}$, $R_{16}$, $R_{18}$, electrically connected in the manner indicated, and it should be appreciated from FIG. 2 that transistor $Q_4$ functions as the optical isolator detector $24_b$ intended to receive optical signals from optical isolator source $24_a$. Further, the sensing elements previously described are shown to include the components $C_3$, $R_2$, $C_1$, and $R_1$ which are electrically connected across the load 36 represented by capacitance $C_o$ and resistance $R_o$.

With continuing reference to FIG. 2, the shunt comparator comprises an error amplification portion, represented by the circuit elements $U_1$, $R_3$, $R_4$, $Q_1$, and a shunt comparator portion represented by circuit components $U_2$, $R_9$, $R_{10}$, $R_{11}$, $Q_2$, $CR_{13}$, $CR_3$, $C_6$, $R_{15}$, and $R_{17}$. The source error amp/shunt comparator, as set forth above, functions to compare the input signal $E_s$ with an analogous divided down voltage $E_o$ and distributes control information to both triodes 28, 30 to ensure that both triodes do not simultaneously conduct. As indicated, the high voltage D.C. supply 32 is connected through the load 36 when triode 28 is on and charging the output to the desired level. When the triode 28 is off, that is, when the output voltage level is to be reduced or when the output level has over-shot the intended level, the sink triode 30 activates and the voltage across the load 36 slews to the desired level. The 10 KV voltage supply, not shown in FIG. 2, is electrically connected to the subject circuit so as to provide operating plate voltages to the triodes 28, 30.

The present invention may be subjected to many modifications and changes without departing from the spirit or essential characteristics thereof. The above described embodiment should therefore be considered in all respects as illustrative and not restrictive of the scope of the invention.

What is claimed is:

1. A switchable high voltage d-c power supply capable of rapidly switching between voltage states in response to a variably controllable low level reference voltage input to drive a device having a large capacitance comprising, in combination:

a high output voltage source;

a high voltage/optical isolator having a source portion and an optical detector portion which is connected to said high output voltage source;

a first high voltage/frequency planar triode connected to apply said high output voltage source to the large capacitance device;

a second high voltage/frequency planar triode connected as a sink to the large capacitance device;

output sensing means connected to detect an output voltage across the large capacitance device, said output sensing means having voltage dividing means for scaling down the output voltage to an analogous lower voltage;

a source error amplifier shunt comparator connected to said output sensing means and connected to receive the reference voltage input for comparing said analogous lower voltage with the reference voltage, said comparator being further connected to control the operation of said first triode through said optical isolator and to control the operation of said second triode on the basis of the comparison between said analogous voltage and the reference voltage.

2. A switchable high voltage d-c power supply according to claim 1 further comprising:

filament means connected to said triodes to heat the cathodes of said triodes to operating temperature.

3. A switchable high voltage d.c. power supply according to claim 2 further comprising:

means to delay application of high voltage to said triodes whereby stripping of the triode cathodes is prevented by allowing said filament means adequate time to warm up the triode cathodes to operating temperature.

* * * * *